(12) United States Patent
Kim et al.

(10) Patent No.: US 11,616,025 B2
(45) Date of Patent: Mar. 28, 2023

(54) SELECTIVE EMI SHIELDING USING PREFORMED MASK WITH FANG DESIGN

(71) Applicant: STATS ChipPAC Pte. Ltd., Singapore (SG)

(72) Inventors: ChangOh Kim, Incheon (KR); KyoungHee Park, Seoul (KR); JinHee Jung, Incheon (KR); OMin Kwon, Gyeonggi-do (KR); JiWon Lee, Seoul (KR); YuJeong Jang, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 17/126,621

(22) Filed: Dec. 18, 2020

(65) Prior Publication Data

US 2022/0199545 A1 Jun. 23, 2022

(51) Int. Cl.
| | |
|---|---|
| *H01L 23/552* | (2006.01) |
| *H01L 23/00* | (2006.01) |
| *H01L 21/56* | (2006.01) |
| *H01L 21/033* | (2006.01) |
| *H01L 23/31* | (2006.01) |

(52) U.S. Cl.
CPC ........ *H01L 23/552* (2013.01); *H01L 21/0334* (2013.01); *H01L 21/565* (2013.01); *H01L 23/3107* (2013.01); *H01L 24/13* (2013.01); *H01L 2924/15313* (2013.01)

(58) Field of Classification Search
None
See application file for complete search history.

(56) References Cited

U.S. PATENT DOCUMENTS

| 8,576,574 | B2 * | 11/2013 | Wong ............... H01L 23/552 |
| | | | 361/764 |
| 9,332,646 | B2 * | 5/2016 | Chen ............... H05K 3/284 |
| 2013/0037923 | A1 | 2/2013 | Yoo |
| 2017/0077039 | A1 | 3/2017 | Liao et al. |
| 2020/0075502 | A1 | 3/2020 | Kim et al. |

\* cited by examiner

*Primary Examiner* — Long Pham
(74) *Attorney, Agent, or Firm* — Brian M. Kaufman; Robert D. Atkins; Patent Law Group: Atkins and Associates, P.C.

(57) ABSTRACT

A semiconductor device has a semiconductor package including a substrate comprising a land grid array. A component is disposed over the substrate. An encapsulant is deposited over the component. The land grid array remains outside the encapsulant. A fanged metal mask is disposed over the land grid array. A shielding layer is formed over the semiconductor package. The fanged metal mask is removed after forming the shielding layer.

23 Claims, 14 Drawing Sheets

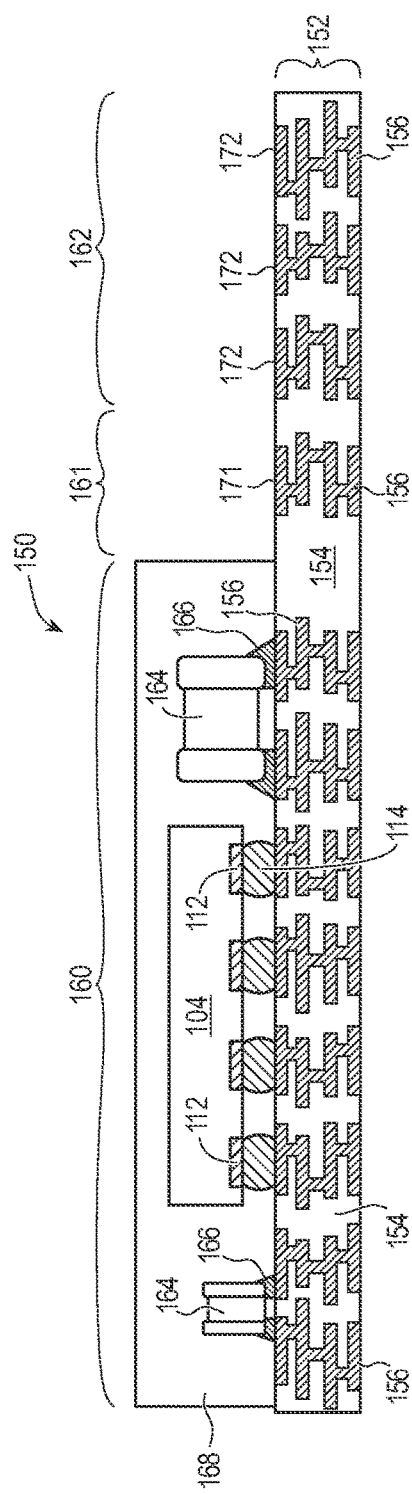
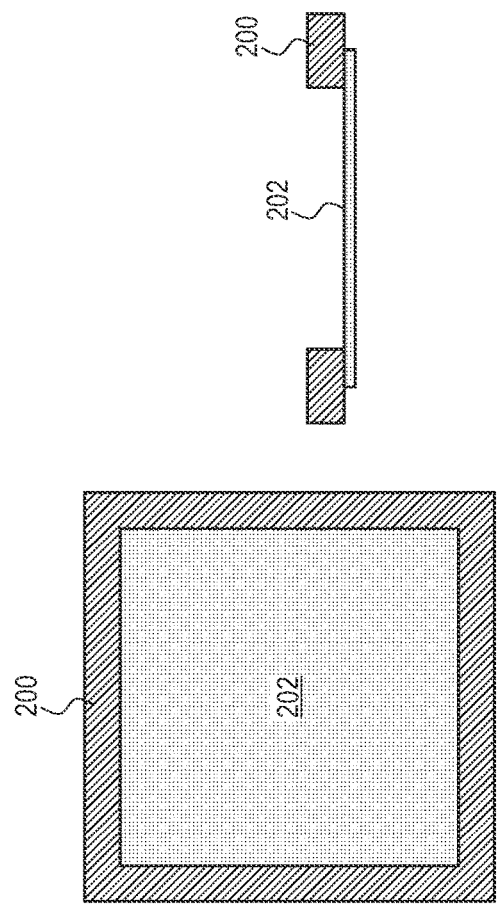
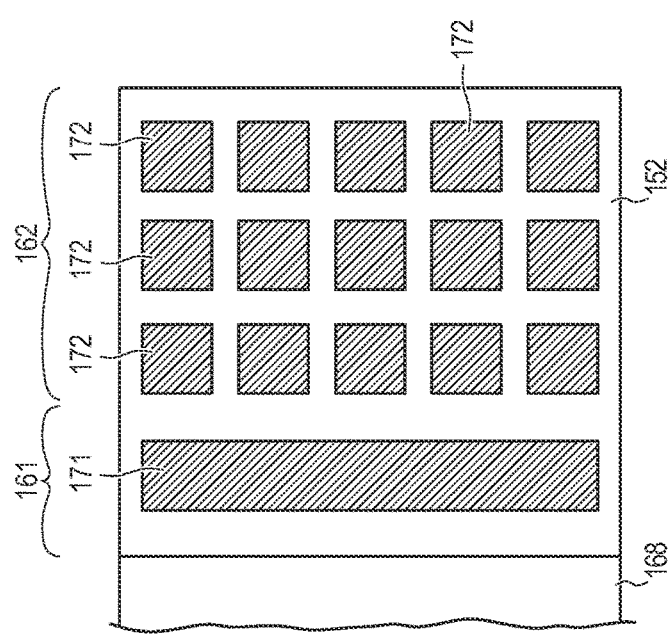
FIG. 2a
FIG. 2c
FIG. 2b

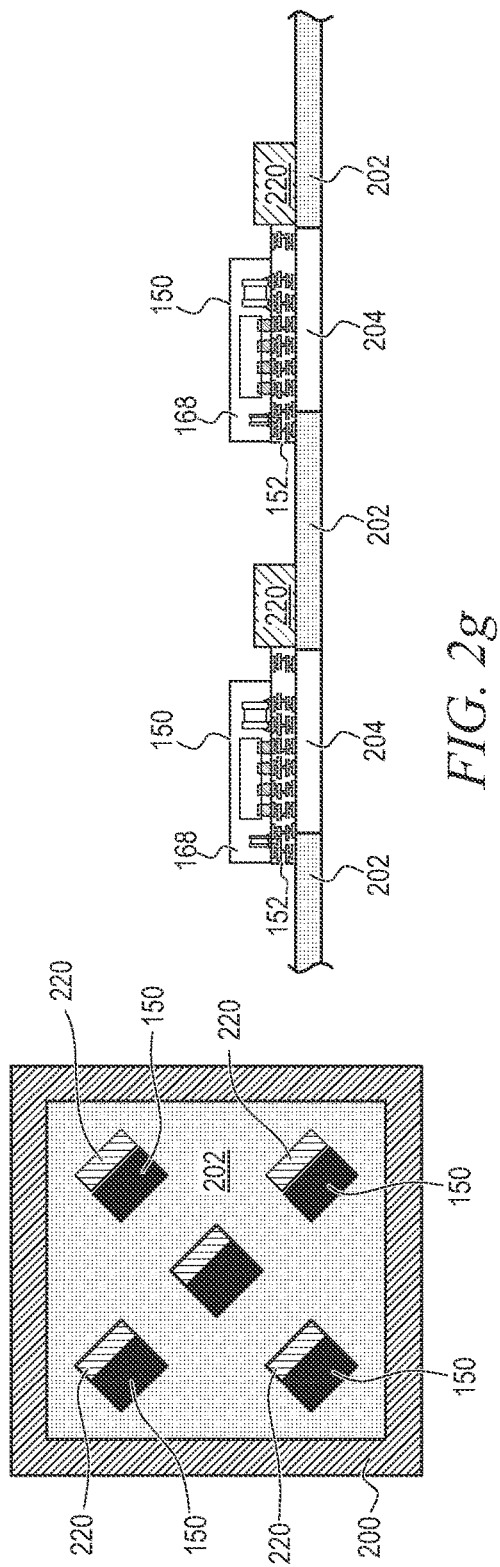
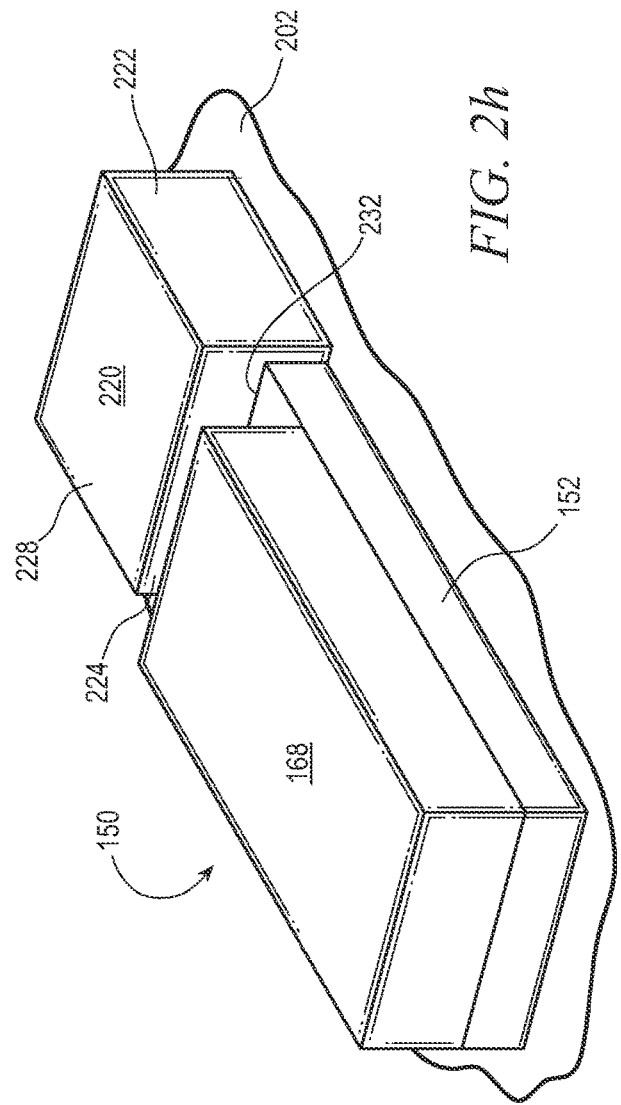

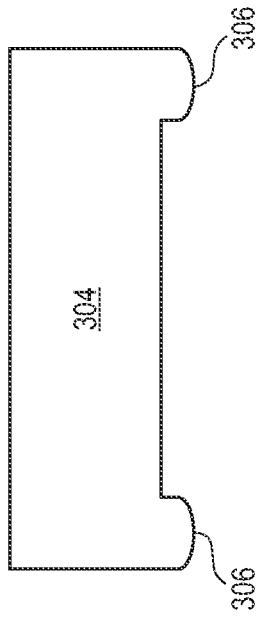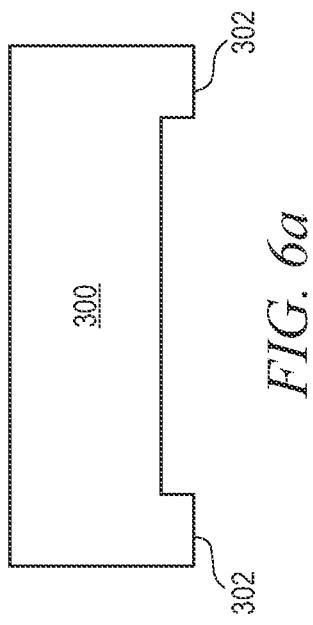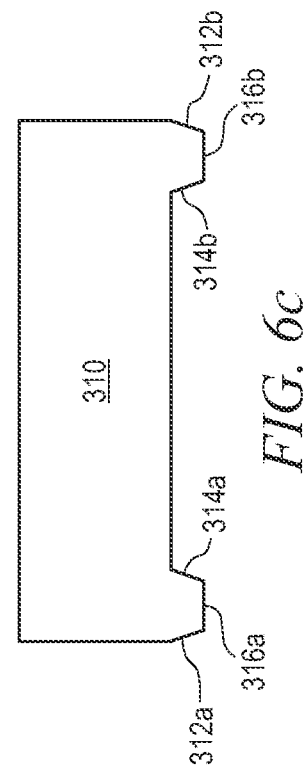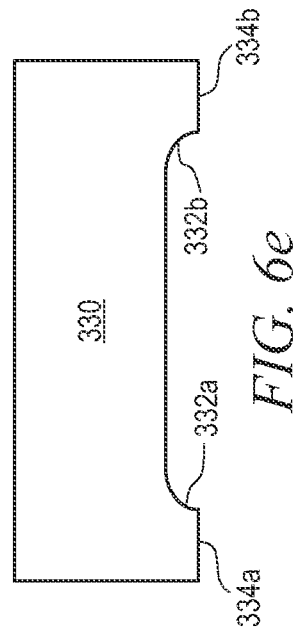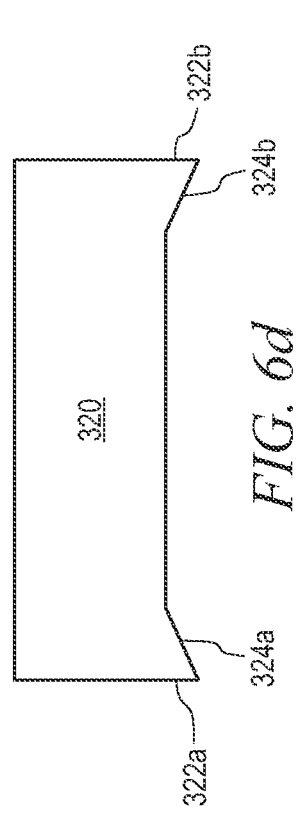
FIG. 6a
FIG. 6b
FIG. 6c
FIG. 6d
FIG. 6e

SELECTIVE EMI SHIELDING USING PREFORMED MASK WITH FANG DESIGN

FIELD OF THE INVENTION

The present invention relates in general to semiconductor manufacturing and, more particularly, to a semiconductor device and method for forming selective electromagnetic interference (EMI) shielding using preformed masks.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices are often susceptible to electromagnetic interference (EMI), radio frequency interference (RFI), harmonic distortion, or other inter-device interference, such as capacitive, inductive, or conductive coupling, also known as cross-talk, which can interfere with their operation. High-speed analog circuits, e.g., radio frequency (RF) filters, or digital circuits also generate interference.

Conductive layers are commonly formed over semiconductor packages to shield electronic parts within the package from EMI and other interference. Shielding layers absorb EMI before the signals can hit semiconductor die and discrete components within the package, which might otherwise cause malfunction of the device. Shielding layers are also formed over packages with components that are expected to generate EMI to protect nearby devices.

One problem with prior art methods of semiconductor package shielding is that forming the shielding layer over a package completely covers the top of the package. Many semiconductor packages need open areas with exposed sockets or terminals that allow connection to adjacent semiconductor devices, or need to have some components outside of the shielding layer to perform their proper function. Unfortunately, traditional shielding completely covers the packages and would short circuit any exposed terminals, sockets, or other exposed components. Tape masks have been used to form partially shielded packages. However, tape masks have complex process requirements to laminate the mask and then peel the mask after sputtering. Therefore, a need exists for semiconductor devices with selectively formed EMI shielding.

BRIEF DESCRIPTION OF THE DRAWINGS

FIGS. 2a-2m illustrate selectively forming a shielding layer using a preformed mask;

FIGS. 6a-6e illustrate additional footprint profile shapes for the mask fangs.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices. The terms "die" and "semiconductor die" are used interchangeably.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, wirebonds, or other suitable interconnect structure. An encapsulant or other molding compound is deposited over the package to provide physical support and electrical isolation. The finished package is then inserted into an electrical system and the functionality of the semiconductor device is made available to the other system components.

Figure 1A:
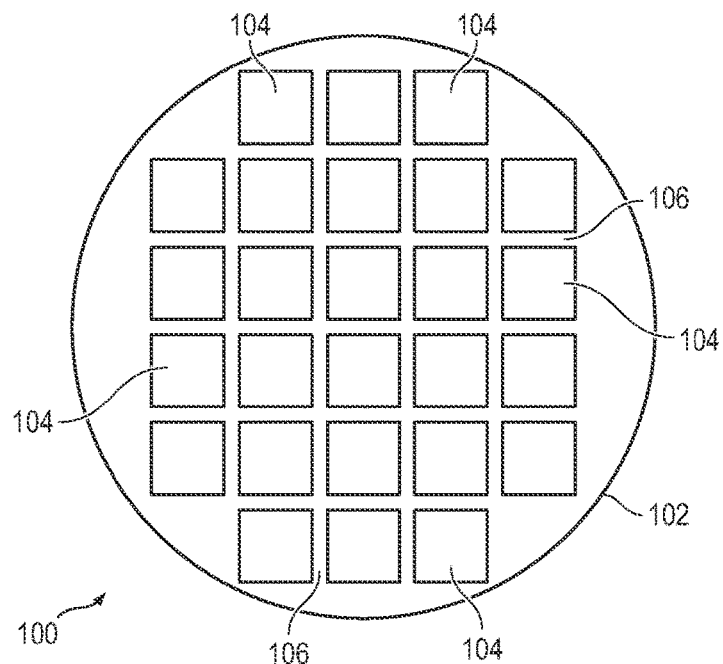
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk semiconductor material. A plurality of semiconductor die or components 104 is formed on wafer 100 separated by a non-active, inter-die wafer area or saw street 106 as described above. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
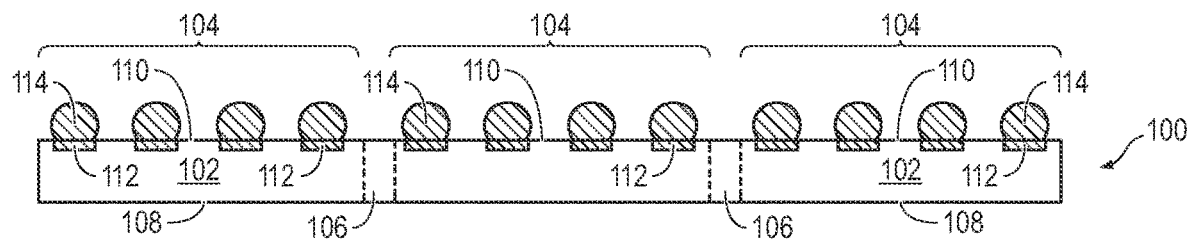

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within or over the die and electrically interconnected according to the electrical design and function of the die. For example, the circuit may include one or more transistors, diodes, and other circuit elements formed within active surface 110 to implement analog circuits or digital circuits, such as digital signal processor (DSP), ASIC, MEMS, memory, or other signal processing circuit. Semiconductor die 104 may also contain integrated passive devices (IPDs), such as inductors, capacitors, and resistors, for RF signal processing. Back surface 108 of semiconductor wafer 100 may undergo an optional backgrinding operation with a mechanical grinding or etching process to remove a portion of base material 102 and reduce the thickness of semiconductor wafer 100 and semiconductor die 104.

An electrically conductive layer 112 is formed over active surface 110 using PVD, CVD, electrolytic plating, electroless plating process, or other suitable metal deposition process. Conductive layers 112 include one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

Conductive layer 112 can be formed as contact pads disposed side-by-side a first distance from the edge of semiconductor die 104, as shown in FIG. 1b. Alternatively, conductive layer 112 can be formed as contact pads that are offset in multiple rows such that a first row of contact pads is disposed a first distance from the edge of the die, and a second row of contact pads alternating with the first row disposed a second distance from the edge of the die. Conductive layer 112 represents the last conductive layer formed over semiconductor die 104 with contact pads for subsequent electrical interconnect to a larger system. However, there may be one or more intermediate conductive and insulating layers formed between the actual semiconductor devices on active surface 110 and contact pads 112 for signal routing.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form conductive balls or bumps 114. In one embodiment, conductive bumps 114 are formed over an under-bump metallization (UBM) having a wetting layer, barrier layer, and adhesion layer. Conductive bumps 114 can also be compression bonded or thermocompression bonded to conductive layer 112. Conductive bumps 114 represents one type of interconnect structure that can be formed over conductive layer 112 for electrical connection to a substrate. The interconnect structure can also use bond wires, conductive paste, stud bump, micro bump, or other electrical interconnect.

Figure 1C:
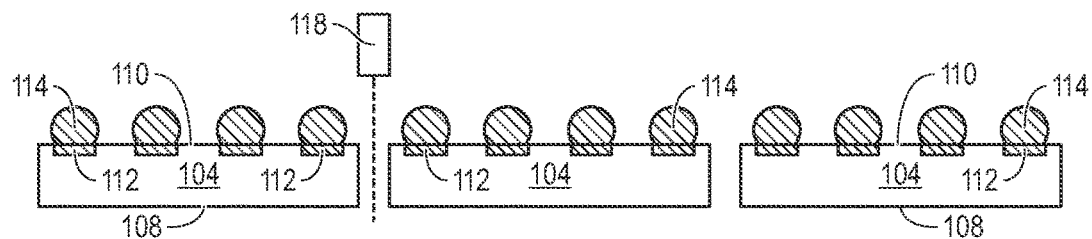

In FIG. 1c, semiconductor wafer 100 is singulated through saw street 106 using a saw blade or laser cutting tool 118 into individual semiconductor die 104. The individual semiconductor die 104 can be inspected and electrically tested for identification of KGD post-singulation.

FIG. 2a illustrates a cross-section of an exemplary semiconductor package 150 prior to selectively forming a shielding layer. Semiconductor package 150 is a system-in-package (SiP) device in some embodiments. Substrate 152 includes one or more insulating layers 154 interleaved with one or more conductive layers 156. Insulating layer 154 is a core insulating board in one embodiment, with conductive layers 156 patterned over the top and bottom surfaces, e.g., a copper-clad laminate substrate. Conductive layers 156 also include conductive vias electrically coupled through insulating layers 154.

Substrate 152 can include any number of conductive layers 156 and insulating layers 154 interleaved over each other. A solder mask or passivation layer can be formed over either side or both sides of substrate 152. Openings are formed in the passivation layer to expose contact pads of conductive layer 156 for subsequent interconnection. Any suitable type of substrate or leadframe is used for substrate 152 in other embodiments. Typically, packages 150 are formed on substrate 152 as a panel large enough to form several to hundreds or thousands of packages at one time. Packages 150 are then singulated into individual packages, of which FIG. 2a shows an example, by cutting through encapsulant 168 and substrate 152.

Any components desired to be shielded in semiconductor package 150 are mounted to or disposed over substrate 152 within shielding area 160 and electrically connected to conductive layers 156. A shielding interface area 161 is provided for connection of the subsequently formed shielding layer to ground strip 171 of conductive layer 156. A non-shielding area 162 contains other components not intended to be shielded. FIG. 2a illustrates semiconductor die 104 mounted on substrate 152 along with discrete electrical components 164 within shielding area 160 as an example. Discrete components 164 can be passive components such as capacitors, resistors, or inductors, active components such as diodes or transistors, or any other desired electrical component. Multiple semiconductor die can be disposed in shielding area 160. Semiconductor die 104 can be provided as part of a smaller sub-package rather than a bare die.

Semiconductor die 104 is mounted to substrate 152 by disposing the semiconductor die on the substrate using, e.g., a pick-and-place process or machine, and then reflowing bumps 114 to physically and electrically connect the bumps to exposed contact pads of conductive layer 156. Discrete components 164 are connected by similar solder bumps or solder paste 166. Solder paste 166 can be printed onto substrate 152 or discrete components 164 prior to picking and placing the discrete components onto the substrate. Reflowing solder paste 166 physically and electrically couples discrete components 164 to contact pads of conductive layer 156.

After mounting of semiconductor die 104, discrete components 164, and any other desired electrical components onto substrate 152 within shielding area 160, the components are encapsulated by encapsulant or molding compound 168. Encapsulant 168 is deposited over substrate 152, semiconductor die 104, and discrete components 164 using paste printing, compressive molding, transfer molding, liquid encapsulant molding, vacuum lamination, spin coating, or another suitable applicator. Encapsulant 168 can be polymer composite material, such as epoxy resin, epoxy acrylate, or polymer with or without a filler. Encapsulant 168 is non-conductive, provides structural support, and environmentally protects the semiconductor device from external elements and contaminants.

A mask or other mechanism can be used to prevent encapsulant 168 from covering shielding interface area 161 and non-shielding area 162. In other embodiments, encapsulant 168 is deposited over shielding interface area 161 and non-shielding area 162 and then removed in the non-shielding area. A passivation layer formed over the top of substrate 152 can operate as an etch stop layer while removing the encapsulant in non-shielding area 162 and shielding interface area 161. Openings are formed in the passivation layer after encapsulant 168 is removed to expose ground strip 171 and contact pads of land grid array 172.

Any electrical components that are desired to be left unshielded are disposed on or over substrate 152 within non-shielding area 162. Non-shielding area 162 is populated with electrical components after encapsulation with encapsulant 168 to reduce complexity of masking the non-shielding area from being encapsulated. In other embodiments, components can be disposed on substrate 152 in non-shielding area 162 prior to depositing encapsulant 168. Components in non-shielded area 162 can include board-to-board connectors and other physical interfaces, antennae disposed over substrate 152 or formed as part of conductive layers 156, additional discrete components 164, or any other desired electrical components.

In FIG. 2a, no components are disposed or formed in non-shielding area 162 over substrate 152. Contact pads of conductive layer 156 are left exposed as a land grid array 172 for electrical interconnection or for addition of electrical components at a later stage. Another portion of conductive layer 156 is left exposed in shielding interface area 161 as ground strip 171. FIG. 2b shows a top-down plan view of ground strip 171 and land grid array 172. Land grid array 172 provides exposed contact pads to electrically connect to semiconductor die 104 or the underlying device that package 150 is incorporated into. The electrical connection can be made by soldering components or a physical port onto land grid array 172, or a temporary connection can be made using a device with pogo pins or other suitable structure.

Figure 2D:
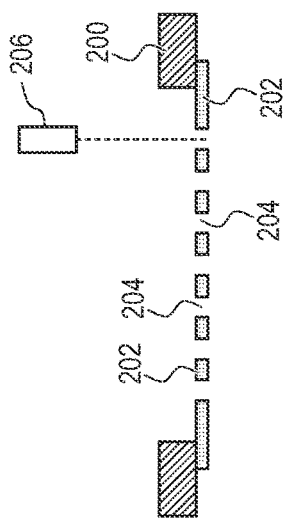
Figure 2D:
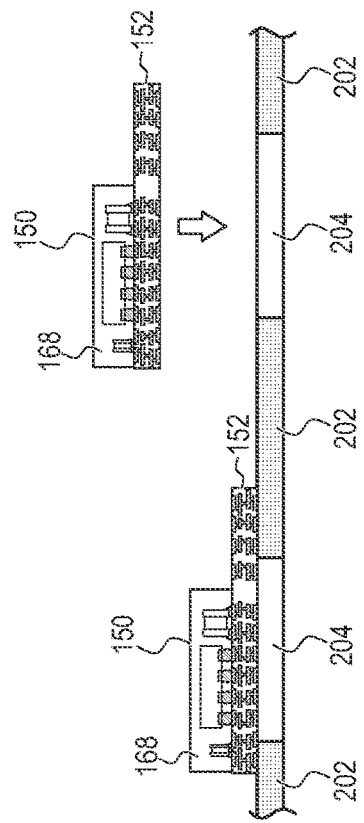
Figure 2D:
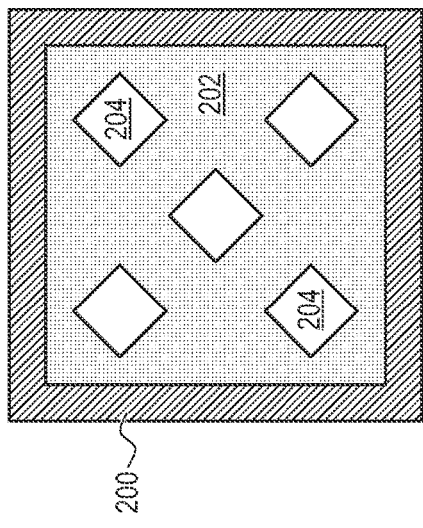
Figure 2E:
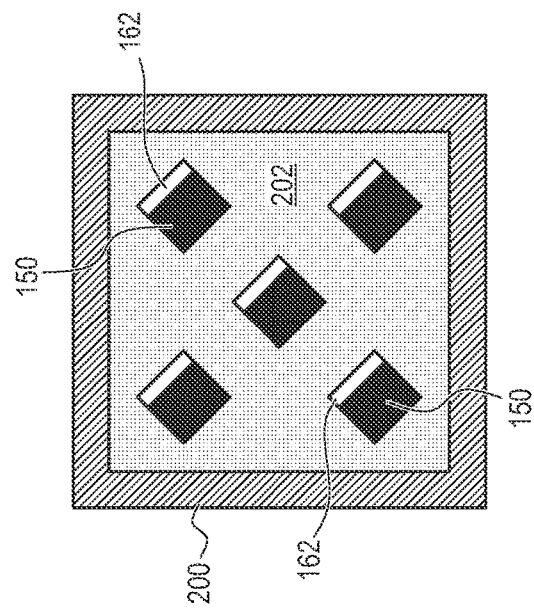

FIG. 2c shows a metal frame 200 and film 202 that will be used as a carrier during formation of a shielding layer over package 150. FIG. 2c includes a top-down view on the left side of the figure and a cross-sectional view on the right side of the figure. FIGS. 2d, 2e, and 2g similarly show both a top-down view and a cross-sectional view of their respective processing steps. Frame 200 can be formed of aluminum, copper, steel, or another suitable metal. Alternatively, frame 200 can be formed from plastic, wood, or any other suitable rigid material. A tape or film 202 is mounted onto frame 200 to form a support base for a plurality of packages 150. Film 202 is formed from polyimide (PI) in one embodiment. Film 202 has an adhesive coated on a surface of the film to allow the film to stick to metal frame 200 and to allow packages 150 to adhere to the film. The adhesive on film 202 can be a thermal or ultraviolet (UV) release adhesive.

In FIG. 2d, a plurality of openings 204 is formed through film 202 using laser cutting tool 206, a mechanical punch, or any other suitable mechanism. Openings 204 are smaller than the footprint of packages 150 to allow the packages to be disposed on film 202 over the openings. Openings 204 facilitate removal of packages 150 from film 202 after forming a shielding layer.

In FIG. 2e, packages 150 are disposed over openings 204 using a pick-and-place process or machine. The bottom of substrate 152 physically contacts film 202 all the way around opening 204 such that each opening 204 is completely covered by a package 150. In one embodiment, the overlap of substrate 152 over film 202 around opening 204 is between 0.1 mm and 0.5 mm on each side of the substrate. In other embodiments, openings 204 extend partially outside of the footprints of packages 150. Adhesive on film 202 sticks packages 140 to the film.

Figure 2F:
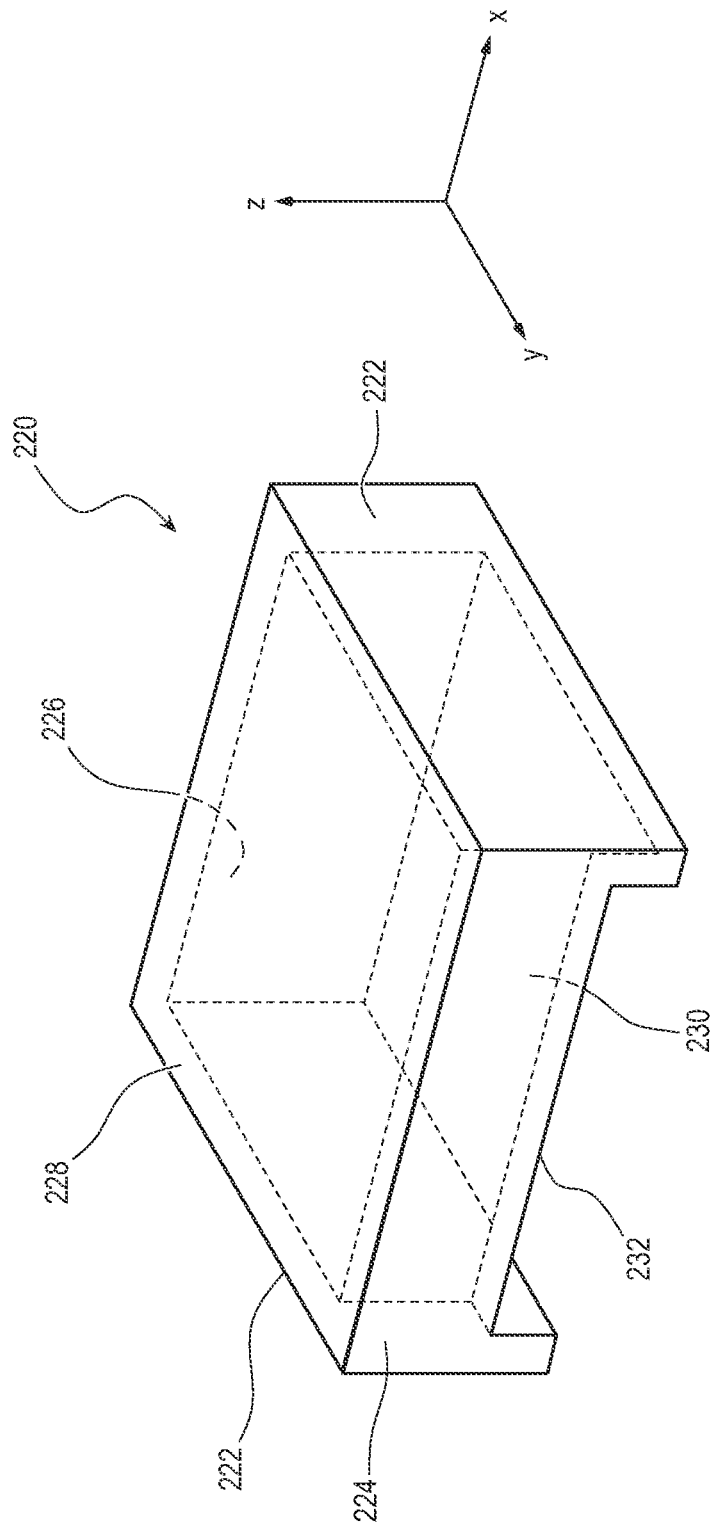

FIG. 2f shows a preformed mask 220 that will be placed over non-shielding area 162 to block a shielding layer from being formed directly on the underlying components. Mask 220 includes sides 222, front 224, back 226, and top 228 that define a mask cavity 230. Each of sides 222, front 224, and back 226 has a height in the Z-axis direction of the illustrated axis. Sides 222 have widths along the Y-axis and thicknesses along the X-axis. Front 224 and back 226 have widths along the X-axis and thicknesses along the Y-axis. Top 228 has a thickness along the Z-axis, a length along the X-axis, and a width along the Y-axis.

Land grid array 172 is disposed in mask cavity 230 during formation of the shielding layer. Sides 222 and back 226 have heights that are at least as high as the top of substrate 152. In embodiments with components disposed on substrate 152 within non-shielding area 162, mask 220 is made at least as tall as the tallest component within non-shielding area 162. The bottoms of sides 222 and back 226 can rest on film 202 with top 228 extending over land grid array 172 or other components. Front 224 has a bottom lip 232 that is raised higher than the bottoms of sides 222 and back 226 along the Z-axis. The opening under lip 232 provides space for substrate 152 to extend from under mask 220 to outside the mask.

Lip 232 contacts, or nearly contacts, the top surface of substrate 152 while sides 222 and back 224 extend down to surround the end of the substrate with non-shielding area 162. The length of lip 232 along the X-axis is approximately the same or slightly longer than a width of substrate 152 in the same direction so that sides 222 contact or nearly contact the sides of the substrate. The widths of sides 222 are greater than a width of non-shielding area 162 so that back 226 sits just outside a footprint of substrate 152 when lip 232 is placed on the border between shielding interface area 161 and non-shielding area 162.

Mask 220 is formed of metal, liquid-crystal polymer (LCP), plastic, polymer, Teflon, glass, rubber, wood, film, tape, foil, combinations thereof, or any other solid material that can withstand the process of forming a shielding layer. Mask 220 is formed by molding, by folding or working a sheet of material into the desired shape, or by any other suitable means.

Figure 2I:
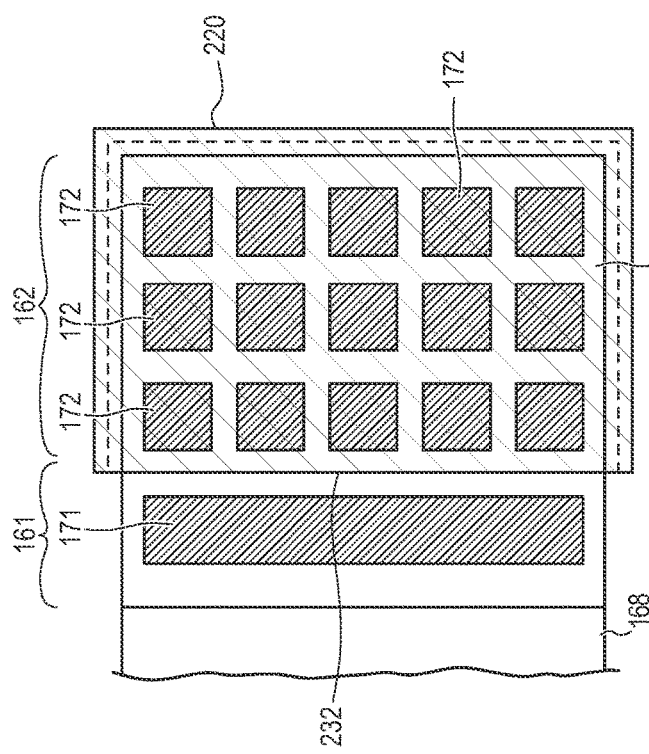

FIGS. 2g-2i show packages 150 with masks 220 picked and placed over non-shielding areas 162. FIG. 2g shows top-down and cross-sectional views, while FIG. 2h shows a perspective view and FIG. 2i shows a detailed top-down plan view. Mask 220 covers non-shielding area 162 to block metal molecules from being deposited on land grid array 172 during sputtering of a shielding layer. Shielding area 160 and shielding interface area 161 remain exposed for the formation of a shielding layer over those areas.

Land grid array 172, or any desired non-shielded electrical components, are disposed within cavity 230 of mask 220. The bottoms of sides 222 and back 226 rest on film 202. Lip 232 on the bottom of front 224 contacts or is slightly above the top surface of substrate 152. Top 228 extends over the top of land grid array 172. The portion of substrate 152 within non-shielding area 162 extends between sides 222. Sides 222 and back 226 are sized and positioned to contact or nearly contact substrate 152.

Figure 2J:
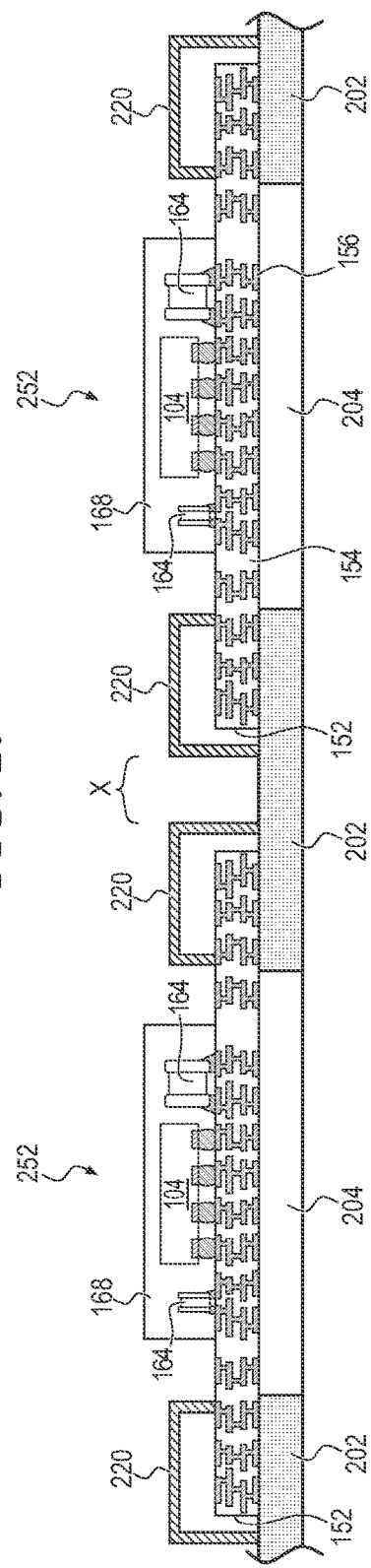

FIG. 2j shows another embodiment where packages 252 each have two land grid arrays 172, one on each of two opposite sides of substrate 152. Two masks 220 are used per package to mask both land grid arrays. When two masks 220 of adjacent packages 252 are disposed directly adjacent to each other, a space 'X' of at least 2 mm is maintained between the masks. Any number of land grid arrays or other components can be used with masks 220 shaped appropriately to cover all of the non-shielded components. Multiple masks are used when the components are disposed in multiple groupings on substrate 152.

Figure 2K:
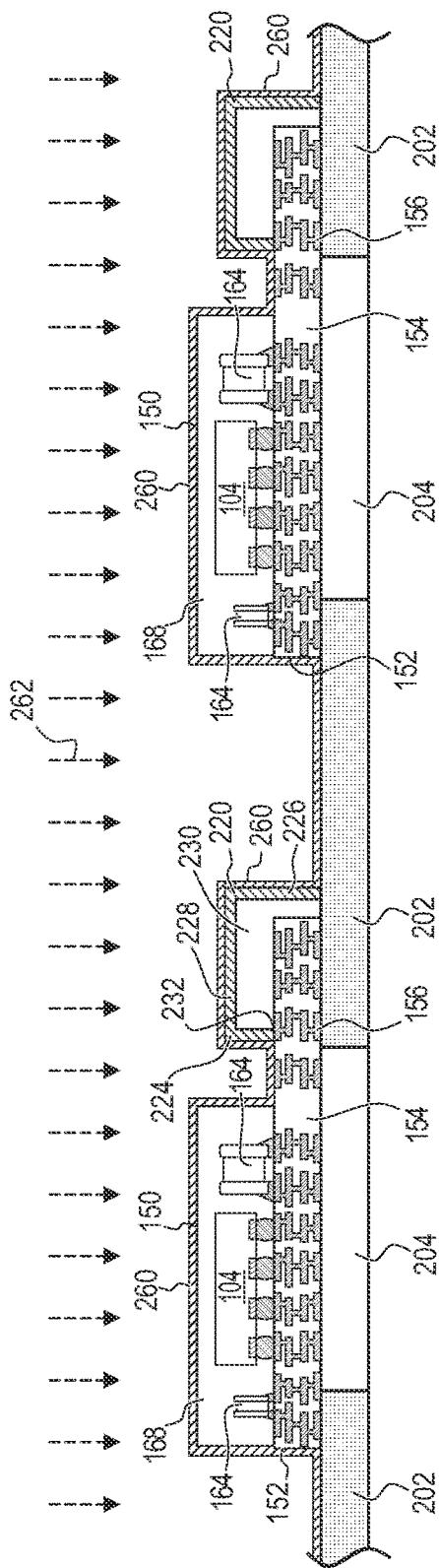

FIG. 2k, continuing from FIGS. 2g-2i, illustrates a conductive material being sputtered over packages 150, as indicated by arrows 262, to form a shielding layer 260. Shielding layer 260 is formed using any suitable metal deposition technique, e.g., chemical vapor deposition, physical vapor deposition, other sputtering methods, spraying, or plating. The sputtered material can be copper, steel, aluminum, gold, combinations thereof, or any other suitable shielding layer material. Shielding layer 260 completely covers exposed surfaces of package 150 and mask 220. In particular, all four side surfaces and the top surface of encapsulant 168 are covered by shielding layer 260 to surround the encapsulated components. Shielding layer 260 covers mask 220, but the sputtered metal does not penetrate the mask. Shielding layer 260 is therefore not formed directly on land grid array 172. All side surfaces of substrate 152 other than within mask 220 are covered by shielding layer 260.

The top surface of substrate 152 in shielding interface area 161, between encapsulant 168 and mask 220, is covered by shielding layer 260. The top surface of substrate 152 in shielding interface area 161 includes exposed ground strip 171, or a plurality of discrete contact pads, of conductive layer 156 that shielding layer 260 physically contacts to provide an electrical connection to a ground voltage node. In some embodiments, a portion of conductive layer 156 is exposed at a side surface of substrate 152 so that shielding layer 260 physically contacts the conductive layer on the sides of the substrate as well.

Figure 2L:
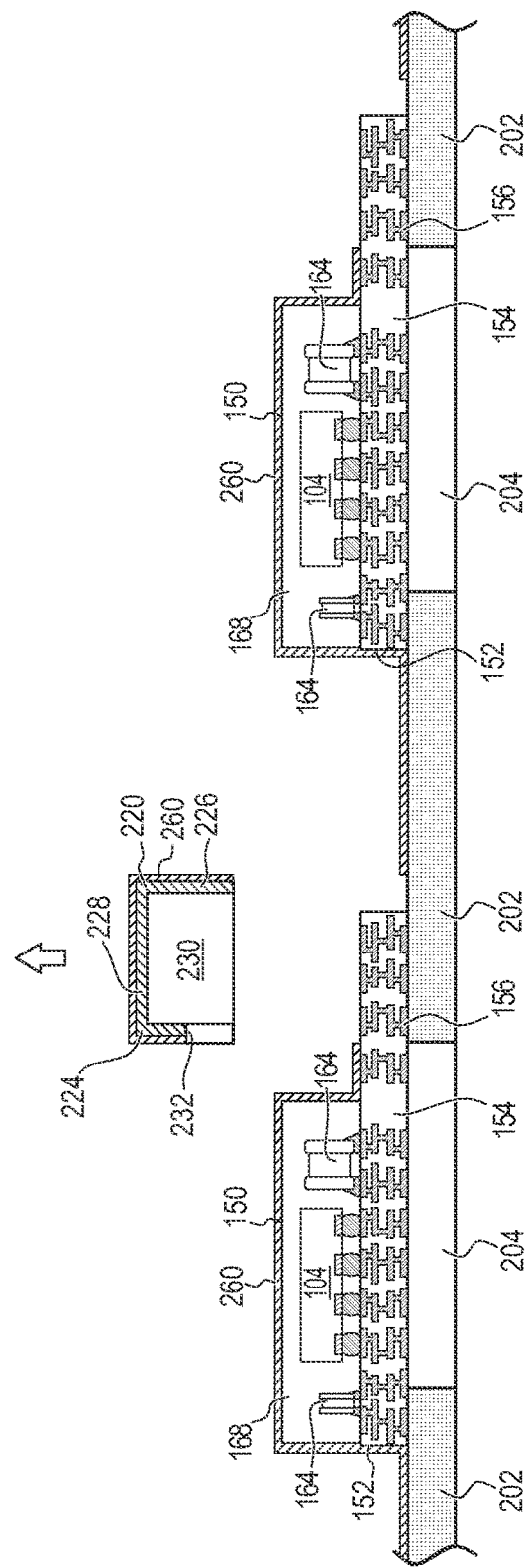

In FIG. 2l, masks 220 are removed, including the portion of shielding layer 260 formed on the masks. Masks 220 can be removed using the same pick and place machine that placed the masks in FIG. 2h or using any other suitable mechanism. With masks 220 removed, the area within frame 200 remains completely covered in shielding layer 260 other than openings in the shielding layer around land grid array 172 where masks 220 had been located.

Masks 220 are reusable, so the pick and place machine places the masks into a tray or other suitable storage medium for later re-application onto the next set of packages to be shielded. Masks 220 may deteriorate after multiple uses, or have another factor that limits the number of times an individual mask can be used. Testing can be done on a particular mask design, and then each mask can be discarded after a suitable number of reuses determined via testing. A metal mask 220 can typically be reused about thirty times.

Figure 2M:
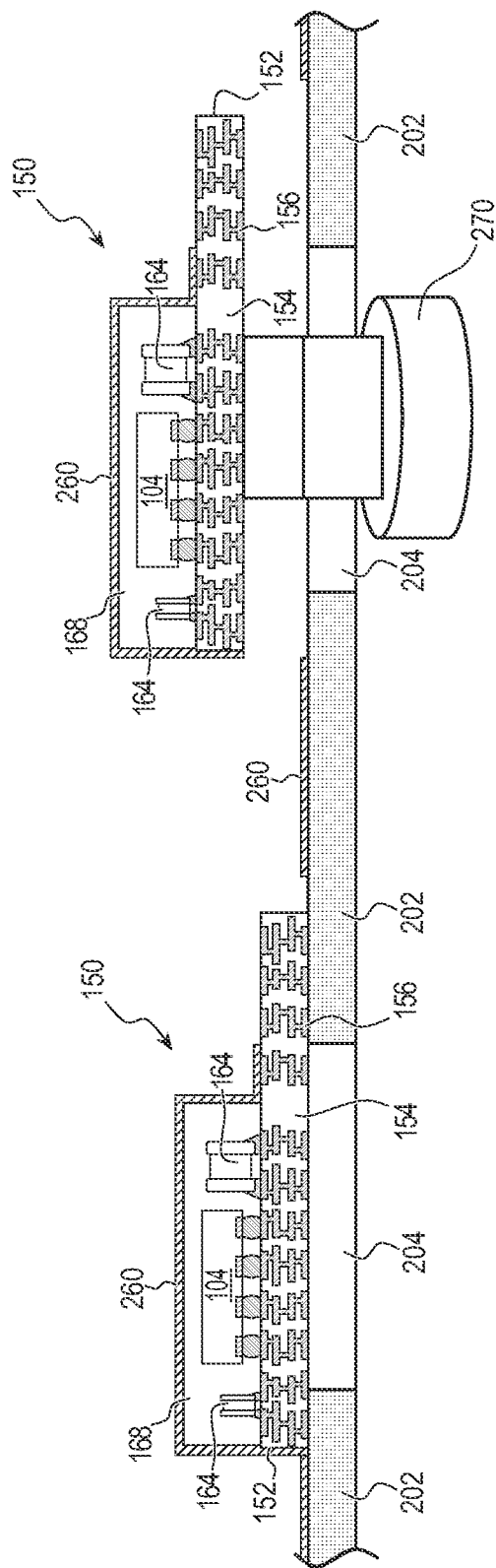

Packages 150 are unloaded from frame 200 and film 202 in FIG. 2m. An actuator 270 presses on the bottom of substrate 152 through openings 204 to release packages 150 from the adhesive of film 202. A UV light or heat can be applied to reduce the effect of the adhesive between film 202 and substrates 152. Actuator 270 can move from package to package in concert with a pick and place machine that takes the lifted package 150 and loads a JEDEC tray, tape and reel, or other similar storage medium with the shielded packages. Shielding layer 260 remains covering encapsulant 168, a portion of the side surfaces of substrate 152, and the top surface of the substrate within shielding interface area 161.

Figure 3:
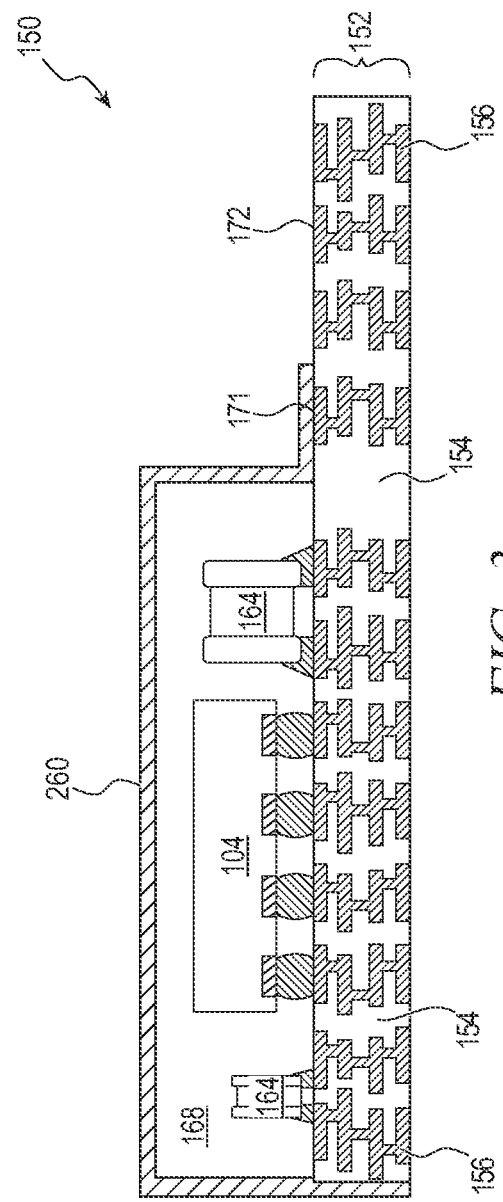
FIG. 3 illustrates a semiconductor device with the selectively formed shielding layer.

FIG. 3 shows an enlarged cross-section of a completed package 150. Shielding layer 260 surrounds semiconductor die 104 and discrete components 164 on all sides and on top. Shielding layer 260 extends down the side surfaces of substrate 152 within shielding area 160 and shielding interface area 161. Shielding layer 260 covers the top surface of substrate 152 within shielding interface area 161, including physically contacting ground strip 171. Masks 220 have ensured that shielding layer 260 does not cover the portion of substrate 152 with land grid array 172 so that the land grid array remains available for later use.

In some embodiments, the bottom surface of substrate 152, opposite semiconductor die 104, has solder bumps or another suitable interconnect structure formed on contact pads of conductive layer 156 for attaching and connecting packages 150 to a larger PCB of an electronic device. Contact pads of conductive layer 156 can remain exposed on the bottom surface as a bottom land grid array rather than adding another interconnect structure. While the process illustrated uses a metal frame 200 and film 202 as a carrier for packages 150 during formation of shielding layer 260, any suitable type of carrier can be used, such as a panel of glass, aluminum, steel, copper, polymer, silicon, or another suitable material.

Mask 220 has the advantages of being simple and reducing costs. Simplicity is provided by using a mask that can be placed and removed using common pick-and-place processing equipment. Cost is reduced by reusing mask 220. The overall process is streamlined by allowing non-shielded components to be disposed on substrate 152 during the same manufacturing stage as shielded components, e.g., semiconductor die 104. Prior art masking methods, e.g., tape masking, require that non-shielding area 162 remain free of components until after the shielding layer is formed and the mask is removed.

Figure 4:
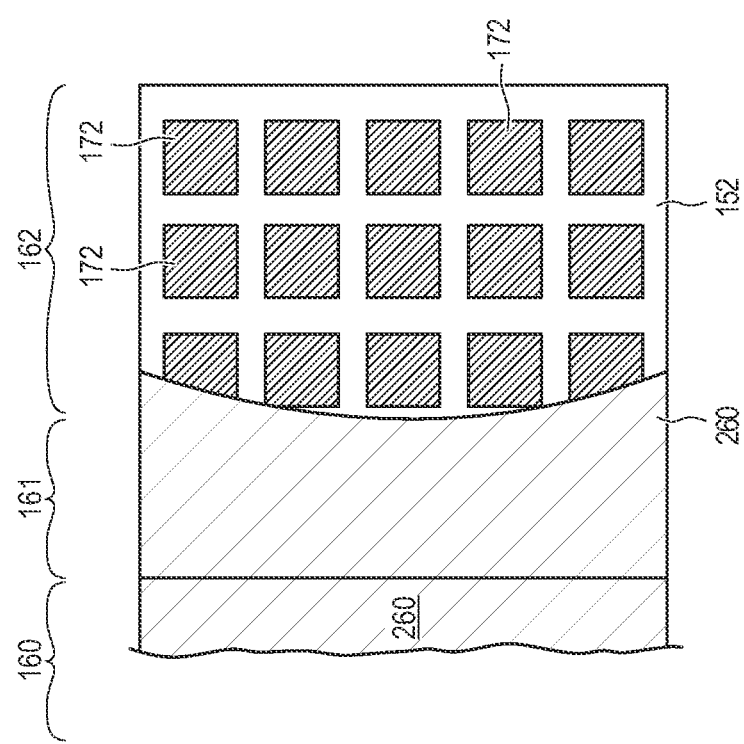
FIG. 4 illustrates a potential manufacturing defect that is likely to cause device malfunction.

Depending on the exact tolerances of the manufacturing processes used to make mask 220 and substrate 152, there may end up being a significant side gap between sides 222 of the mask and the sides of the substrate. A top gap between the top surface of substrate 152 and lip 232 of mask 220 may also be significant. For some manufacturing flows, sputtered metal may undesirably infiltrate into non-shielding area 162 through the top and side gaps. In extreme cases, shielding layer 260 is formed under mask 220 far enough to physically contact some of the contact pads of land grid array 172 as shown in FIG. 4. Having shielding layer 260 unexpectedly short circuit part of land grid array 172 to ground strip 171 is likely to cause malfunction of package 150.

Shielding layer 260 generally extends further toward land grid array 172 at the sides of substrate 152, i.e., closer to the top and bottom in the orientation of FIG. 4, as compared to the middle of the substrate. More sputtered metal is deposited under mask 220 at the sides of substrate 152 because of the gap between the side of the substrate and sides 222 of the mask in combination with the gap under lip 232.

Figure 5A:
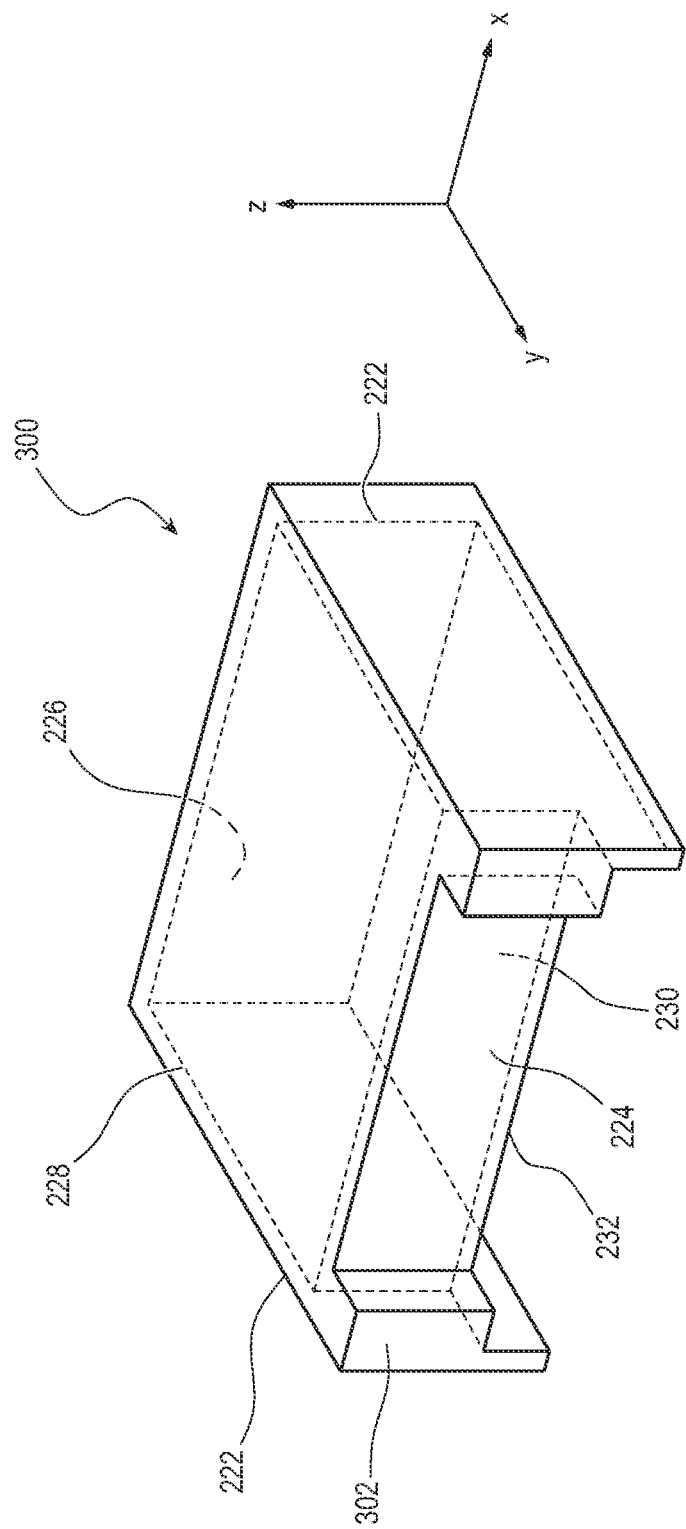
FIGS. 5a-5c illustrate a preformed mask with a fang design alleviating the manufacturing defect.
Figure 5B:
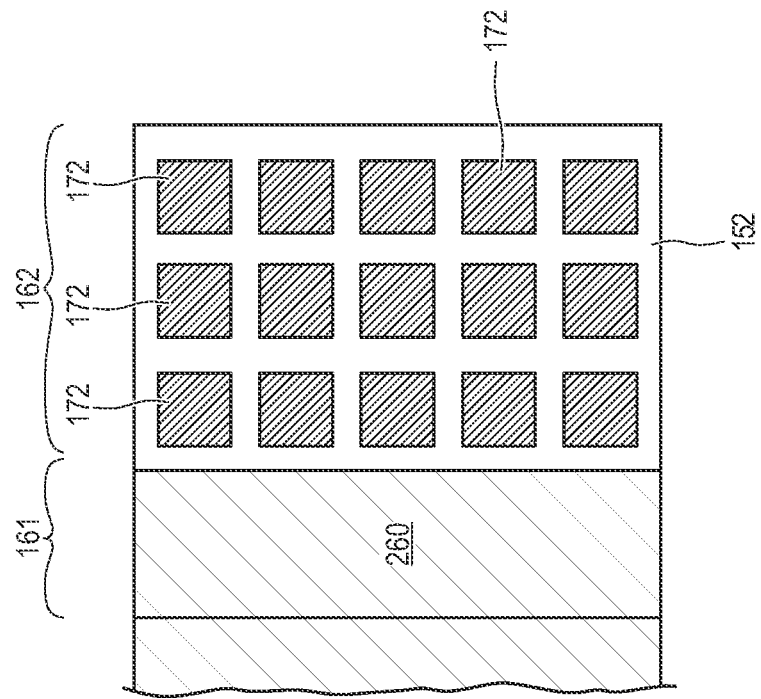

FIGS. 5a and 5b show a mask 300 with a fanged design. FIG. 5a shows a perspective view and FIG. 5b shows a top-down view. Sides 222 of mask 300 extend further toward shielding area 160 compared to mask 220, while front 224 remains on the border between shielding interface area 161 and non-shielding area 162. The difference in position between front 224 and sides 222 along the y-axis results in a pair of fangs 302 formed between sides 222 and front 224. The width of front 224 is reduced from 100% of the mask 220 width to between 70% and 90% of the mask 300 width. The remaining width is made up by fangs 302. Front 224 and fangs 302 can be formed in any suitable proportion of the overall width of mask 300 in other embodiments. Lip 232 follows along front 224 and fangs 302 all the way to sides 222, creating a gap under the lip that is the same length along the x-axis as in mask 220.

Fangs 302 move the front of mask 300 at the sides of substrate 152 away from land grid array 172 and toward ground strip 171. The gap between sides 222 of mask 300 and substrate 152 is moved away from land grid array 172, which reduces the likelihood that sputtered metal infiltrating into the side gap will reach the land grid array. Just the movement of the side gap further from land grid array 172 may be sufficient to prevent shielding layer 260 from being formed in contact with land grid array 172. In one embodiment, mask 220 is modified by lengthening sides 222 further toward shielding area 160 without modifying front 224 and lip 232.

The additional reduction in sputtered metal through the top gap, between substrate 152 and lip 232, depends on the widths of fangs 302. The widths of fangs 302 can be customized to affect a desired reduction in sputtered metal at the sides of substrate 152. Widening fangs 302 more toward the center of mask 300, and thereby reducing the width of front 224, will result in a greater reduction in the likelihood of shielding layer 260 being formed in contact with land grid array 172. Fangs 302 are each generally between 5 and 15 percent of the total width of mask 300. In one embodiment, each fang 302 has a width that is 10% of the overall mask 300 width, and front 224 occupies the remaining 80% of the width. Any suitable widths can be used in other embodiments.

Figure 5C:
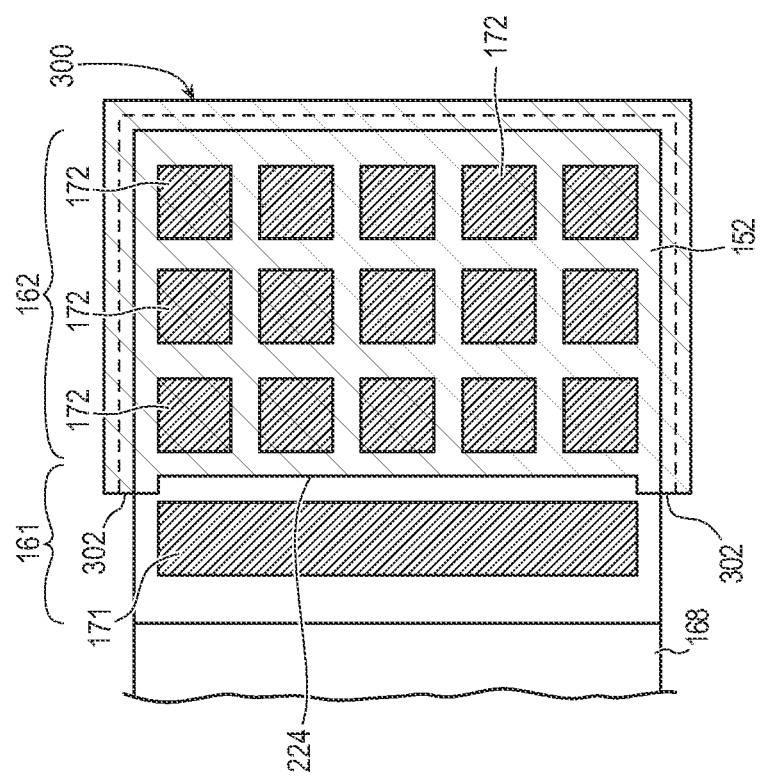

FIG. 5c shows shielding layer 260 after being formed with mask 300. Fangs 302 push shielding layer 260 at the sides of substrate 152 away from land grid array 172 and back toward shielding area 160. Sputtered particles have further to travel from the side gap between substrate 152 and mask 300 to land grid array 172, and therefore insufficient particles are deposited to short circuit the land grid array to the shielding layer. Manufacturing defects are reduced by reducing the likelihood of short circuit between shielding layer 260 and land grid array 172.

FIGS. 6a-6e illustrate options for the footprint profile shape of mask fangs. The various fang shapes can be used to get more of a straight-line profile shape for the boundary of shielding layer 260 between shielding interface area 161 and non-shielding area 162. Testing can be done given a specific package to be shielded using given sputtering equipment and other manufacturing conditions to determine a mask fang profile that results in an optimal shielding layer 260 borderline for the given situation.

FIG. 6a shows the rectangular profile illustrated above. FIG. 6b shows mask 304 with a similar fang design. Front surfaces 306 of the fangs are rounded instead of planar. The curvature of front surfaces 306 can be configured as desired to modify the resultant shape of the shielding layer 260 border.

FIG. 6c shows a mask 310 with trapezoidal fangs. The trapezoidal fangs comprise outer side surfaces 312a and 312b, inner side surfaces 314a and 314b, and front surfaces 316a and 316b. The angles and lengths of all six surfaces can be independently configured as desired to obtain a desired shape for the border of shielding layer 260.

FIG. 6d shows a mask 320 with triangular fangs. The triangular fangs comprise outer surfaces 322a and 322b and inner surfaces 324a and 324b. Outer surfaces 322a and 322b are parallel to and continuous with sides 222. In other embodiments, outer surfaces 322a and 322b can be angled inward if desired. The angles and lengths of surfaces 322a, 322b, 324a, and 324b can be configured to produce a desired shielding layer 260 borderline shape.

FIG. 6e shows a mask 330 with curved transitions 332a and 332b between front fang surfaces 334a and 334b and front surface 224. Front fang surfaces 334a and 334b are the same as in mask 300, and curved transitions 332 are added. Curved transitions 332a and 332b are illustrated as being concave arcs, but the transitions can be rounded in a convex manner, S-curves, straight lines, or any other suitable curve or shape. Transitions 332a and 332b can be mirror images of each other as illustrated, or different curves can be used for the two transitions. Transitions 332a and 332b can be customized to achieve a desired shielding layer 260 borderline.

Figure 7A:
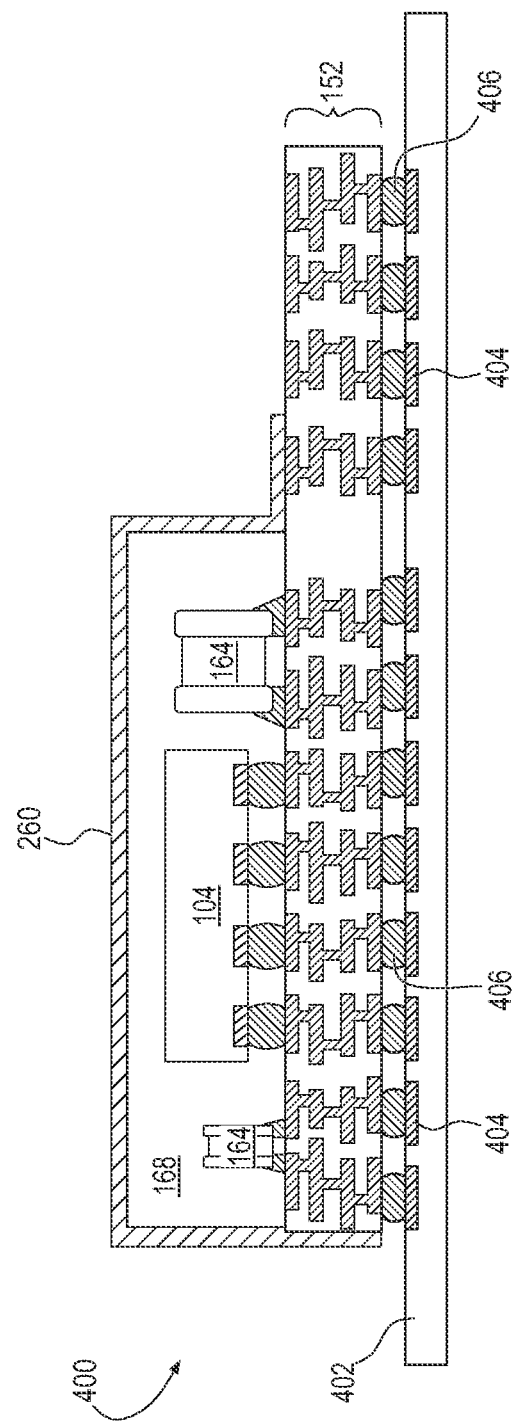
FIGS. 7a and 7b illustrate integrating the selectively shielded packages into an electronic device.
Figure 7B:
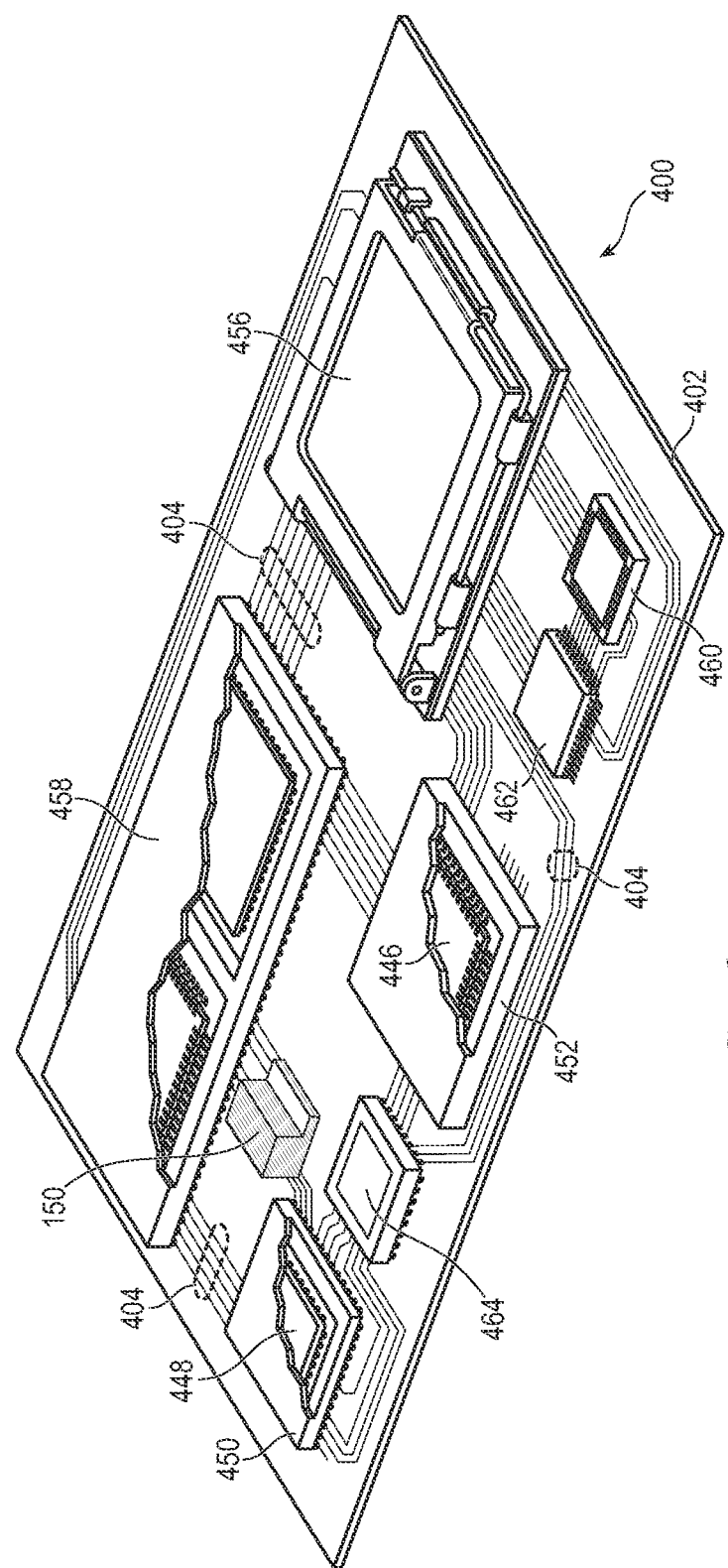

FIGS. 7a and 7b illustrate incorporating the above described shielded packages, e.g., package 150 with shielding layer 260, into an electronic device. FIG. 7a illustrates a partial cross-section of package 150 mounted onto a printed circuit board (PCB) or other substrate 402 as part of an electronic device 400. Bumps 406 are formed on conductive layer 156 on the bottom of substrate 152. Conductive bumps 406 can be formed at any stage of the manufacturing process, e.g., prior to molding encapsulant 168, prior to singulation, or after forming shielding layer 260. Bumps 406 are reflowed onto conductive layer 404 of PCB 402 to physically attach and electrically connect package 150 to the PCB. In other embodiments, thermocompression or other suitable attachment and connection methods are used. In some embodiments, an adhesive or underfill layer is used between package 150 and PCB 402. Semiconductor die 104 is electrically coupled to conductive layer 404 through substrate 152 and bumps 406.

FIG. 7b illustrates electronic device 400 including PCB 402 with a plurality of semiconductor packages mounted on a surface of the PCB, including package 150 with shielding layer 260 and land grid array 172. Land grid array 172 can have an interconnect structure soldered to or pressed against the land grid array to connect package 150 to PCB 402, another package on PCB 402, another PCB of the same or different electronic device, another package on another PCB, another electronic device, testing equipment, etc. Land grid array 172 can also simply be left exposed for subsequent temporary electrical connection to package 150. Alternatively, other components instead of land grid array 172 remain exposed to provide their intended function without shielding layer 260 interfering. Electronic device 400 can have one type of semiconductor package, or multiple types of semiconductor packages, depending on the application.

Electronic device 400 can be a stand-alone system that uses the semiconductor packages to perform one or more electrical functions. Alternatively, electronic device 400 can be a subcomponent of a larger system. For example, electronic device 400 can be part of a tablet computer, cellular phone, digital camera, communication system, or other electronic device. Electronic device 400 can also be a graphics card, network interface card, or another signal processing card that is inserted into a computer. The semiconductor packages can include microprocessors, memories, ASICs, logic circuits, analog circuits, RF circuits, discrete active or passive devices, or other semiconductor die or electrical components.

In FIG. 7b, PCB 402 provides a general substrate for structural support and electrical interconnection of the semiconductor packages mounted on the PCB. Conductive signal traces 404 are formed over a surface or within layers of PCB 402 using evaporation, electrolytic plating, electroless plating, screen printing, or other suitable metal deposition process. Signal traces 404 provide for electrical communication between the semiconductor packages, mounted components, and other external systems or components. Traces 404 also provide power and ground connections to the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 402. In other embodiments, a semiconductor device may only have the first level packaging where the die is mechanically and electrically mounted directly to PCB 402.

For the purpose of illustration, several types of first level packaging, including bond wire package 446 and flipchip 448, are shown on PCB 402. Additionally, several types of second level packaging, including ball grid array (BGA) 450, bump chip carrier (BCC) 452, land grid array (LGA) 456, multi-chip module (MCM) 458, quad flat non-leaded package (QFN) 460, quad flat package 462, and embedded wafer level ball grid array (eWLB) 464 are shown mounted on PCB 402 along with package 150. Conductive traces 404 electrically couple the various packages and components disposed on PCB 402 to package 150, giving use of the components within package 150 to other components on the PCB.

Depending upon the system requirements, any combination of semiconductor packages, configured with any combination of first and second level packaging styles, as well as other electronic components, can be connected to PCB 402. In some embodiments, electronic device 400 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a semiconductor package including,
        a substrate comprising a land grid array,
        a component disposed over the substrate, and
        an encapsulant deposited over the component, wherein the land grid array remains outside the encapsulant;
    disposing a fanged metal mask over the land grid array after the encapsulant has already been deposited over the component, wherein the fanged metal mask includes a first fang at a first side of the fanged metal mask and a second fang at a second side of the fanged metal mask, and wherein the first fang and second fang extend in a first direction toward the encapsulant;
    forming a shielding layer over the semiconductor package; and
    removing the fanged metal mask after forming the shielding layer.

2. The method of claim 1, wherein the first fang and second fang both include a rectangular shape in plan view.

3. The method of claim 1, wherein the first fang and second fang both include a trapezoidal shape in plan view.

4. The method of claim 1, further including configuring a shapes of the first fang and second fang to produce an approximately straight borderline of the shielding layer.

5. A method of making a semiconductor device, comprising:
    providing a first semiconductor package comprising a substrate and an encapsulant deposited over only a first portion of the substrate;
    disposing a fanged mask over a second portion of the substrate after the encapsulant is deposited over the first portion of the substrate, wherein the substrate remains exposed in a gap between the fanged mask and encapsulant;
    forming a shielding layer over the encapsulant, wherein the shielding layer is formed on the substrate in the gap between the fanged mask and encapsulant; and
    removing the fanged mask.

6. The method of claim 5, wherein the fanged mask includes a pair of fangs with one fang formed at each side of the fanged mask.

7. The method of claim 6, wherein the fangs include a rectangular shape in plan view.

8. The method of claim 6, wherein the fanged mask further includes a curved transition between each of the fangs and a front surface of the fanged mask.

9. The method of claim 6, wherein the fangs include a rounded surface.

10. The method of claim 6, further including configuring a shape of the fangs to produce an approximately straight borderline of the shielding layer.

11. The method of claim 6, further including disposing the fanged mask with the fangs oriented toward the encapsulant.

12. A method of making a semiconductor device, comprising:
    providing a semiconductor package including an encapsulant;
    disposing a fanged metal mask over the semiconductor package with a gap between the fanged metal mask and encapsulant, wherein the semiconductor package includes an encapsulant prior to the fanged mask being disposed over the semiconductor package;
    forming a shielding layer over the semiconductor package and fanged metal mask; and
    removing the fanged metal mask.

13. The method of claim 12, wherein the fanged metal mask includes a pair of fangs with one fang formed at each side of the fanged metal mask.

14. The method of claim 13, wherein the fangs include a rectangular shape in plan view.

15. The method of claim 13, wherein the fanged metal mask further includes a curved transition between each of the fangs and a front surface of the fanged metal mask.

16. The method of claim 13, wherein the fangs include a rounded surface.

17. The method of claim 13, wherein the fangs include a triangular shape in plan view.

18. The method of claim 13, further including configuring a shape of the fangs to produce an approximately straight borderline of the shielding layer.

19. A method of making a semiconductor device, comprising:
    providing a semiconductor package including an encapsulant;

disposing a fanged mask over the semiconductor package, wherein the semiconductor package includes an encapsulant prior to the fanged mask being disposed over the semiconductor package; and forming a shielding layer over the semiconductor package and fanged mask.

20. The method of claim 19, wherein the fanged mask includes a pair of fangs with one fang formed at each side of the fanged mask.

21. The method of claim 20, wherein the fanged mask further includes a curved transition between each of the fangs and a front surface of the fanged mask.

22. The method of claim 20, wherein the fangs include a rounded surface.

23. The method of claim 20, wherein the fangs include a triangular shape in plan view.

* * * * *